United States Patent
Sowlati

(10) Patent No.: US 7,356,318 B2
(45) Date of Patent: Apr. 8, 2008

(54) QUADRATURE SUBHARMONIC MIXER

(75) Inventor: Tirdad Sowlati, Irvine, CA (US)

(73) Assignee: Skyworks Solutions, Inc., Woburn, MA (US)

( * ) Notice: Subject to any disclaimer, the term of this patent is extended or adjusted under 35 U.S.C. 154(b) by 684 days.

(21) Appl. No.: 10/884,757

(22) Filed: Jul. 2, 2004

(65) Prior Publication Data

US 2006/0003717 A1    Jan. 5, 2006

(51) Int. Cl.
*H04B 1/26* (2006.01)

(52) U.S. Cl. .................. 455/168.1; 455/209; 455/216; 455/358; 455/319; 455/318

(58) Field of Classification Search ............ 455/168.1, 455/426, 333–334, 323–324, 318–319, 329, 455/338, 130, 280, 293, 326, 313–315, 325, 455/112–113, 118, 141, 147, 189.1, 190.1, 455/208, 209, 216, 255, 258–259; 327/206–210, 327/220, 272, 329, 355, 359, 357, 116; 378/298, 378/326; 375/326, 298

See application file for complete search history.

(56) References Cited

U.S. PATENT DOCUMENTS

| | | | |
|---|---|---|---|
| 6,348,830 B1 * | 2/2002 | Rebeiz et al. ............... | 327/355 |
| 6,810,242 B2 * | 10/2004 | Molnar et al. ............... | 455/326 |
| 6,828,844 B2 * | 12/2004 | Suzuki et al. ................ | 327/359 |
| 6,882,191 B2 * | 4/2005 | Kwok ........................... | 327/122 |
| 7,003,274 B1 * | 2/2006 | Olip ............................. | 455/260 |
| 7,062,247 B2 * | 6/2006 | Kovacevic et al. ......... | 455/323 |
| 7,088,982 B1 * | 8/2006 | Chien .......................... | 455/326 |
| 7,155,194 B2 * | 12/2006 | Chiu et al. ................... | 455/323 |
| 2004/0063419 A1 * | 4/2004 | Molnar et al. ............... | 455/322 |
| 2004/0214547 A1 * | 10/2004 | Kim et al. .................... | 455/296 |
| 2006/0039505 A1 * | 2/2006 | Kim .............................. | 375/322 |
| 2006/0061507 A1 * | 3/2006 | Mohamadi ................... | 342/372 |
| 2006/0062507 A1 | 3/2006 | Mohamadi | |

* cited by examiner

*Primary Examiner*—Pablo N. Tran

(57) ABSTRACT

A quadrature subharmonic mixer comprises a polyphase filter configured to generate quadrature components of a local oscillator (LO) reference signal, a summing and scaling element configured to create additional components of the LO reference signal, and a plurality of mixer elements configured to multiply the quadrature components of the LO reference signal and the additional components of the LO reference signal with a radio frequency (RF) signal to obtain a downconverted version of the RF signal.

18 Claims, 8 Drawing Sheets

QUADRATURE SUBHARMONIC MIXER

BACKGROUND OF THE INVENTION

1. Field of the Invention

This invention relates generally to receiver circuit architecture in a wireless portable communication device. More particularly, the invention relates to a quadrature subharmonic mixer.

2. Related Art

With the increasing availability of efficient, low cost electronic modules, mobile communication systems are becoming more and more widespread. For example, there are many variations of communication schemes in which various frequencies, transmission schemes, modulation techniques and communication protocols are used to provide two-way voice and data communications in a handheld, telephone-like communication handset. The different modulation and transmission schemes each have advantages and disadvantages.

As these mobile communication systems have been developed and deployed, many different standards, to which these systems must conform, have evolved. For example, in the United States, third generation portable communications systems comply with the IS-136 standard, which requires the use of a particular modulation scheme and access format. In the case of IS-136, the modulation scheme can be 8-quadrature phase shift keying (8QPSK), offset π/4 differential quadrature phase shift keying (π/4-DQPSK) or variations thereof and the access format is TDMA.

In Europe, the global system for mobile communications (GSM) standard requires the use of the gaussian minimum shift keying (GMSK) modulation scheme in a narrow band TDMA access environment, which uses a constant envelope modulation methodology.

Furthermore, in a typical GSM mobile communication system using narrow band TDMA technology, a GMSK modulation scheme supplies a very low noise phase modulated (PM) transmit signal to a non-linear power amplifier directly from an oscillator. In such an arrangement, a non-linear power amplifier, which is highly efficient, can be used thus allowing efficient modulation of the phase-modulated signal and minimizing power consumption. Because the modulated signal is supplied directly from an oscillator, the need for filtering, either before or after the power amplifier, is minimized. Further, the output in a GSM transceiver is a constant envelope (i.e., a non time-varying signal containing only a phase modulated (PM) signal) modulation signal.

One of the advances in portable communication technology is the move toward the implementation of a low intermediate frequency (IF) receiver and a direct conversion receiver (DCR). A low IF receiver converts a radio frequency (RF) signal to an intermediate frequency that is lower than the IF of a convention receiver. A direct conversion receiver downconverts a radio frequency (RF) received signal directly to baseband (DC) without first converting the RF signal to an intermediate frequency (IF). One of the benefits of a direct conversion receiver is the elimination of costly filter components used in systems that employ an intermediate frequency conversion.

When converting a received RF signal either to an intermediate frequency signal, or directly to a baseband signal, one or more mixers are used to downconvert the received RF signal. A mixer combines the received RF signal with a reference signals, referred to as a "local oscillator," or "LO" signal. The resultant signal is the received signal at a different, and typically lower, frequency. One mixer technology used today is referred to as a "subharmonic" mixer. A subharmonic mixer uses an LO signal that is lower than, and typically on the order of one-half of the LO signal. A subharmonic mixer generally produces lower "self-mixing" components and generally reduces or eliminates feedback to the system antenna.

However, when implementing a subharmonic mixer, either the received RF signal or the LO signal must be altered to produce signals having 90° phase separation to reliably extract the in-phase (I) and the quadrature (Q) components of the received signal. Unfortunately, altering the RF signal requires the use of lossy polyphase filters and altering the LO signal requires the use of complex and inefficient phase shift circuitry to generate what is referred to as a "stair-step" function. Each of these techniques require substantial power and reduce receiver efficiency.

Therefore, it would be desirable to provide a simple and efficient subharmonic mixer.

SUMMARY

Embodiments of the invention include a quadrature subharmonic mixer, comprising a polyphase filter configured to generate quadrature components of a local oscillator (LO) reference signal, a summing and scaling element configured to create additional components of the LO reference signal, and a plurality of mixer elements configured to combine the quadrature components of the LO reference signal and the additional components of the LO reference signal with a radio frequency (RF) signal to obtain a downconverted RF signal.

Related methods of operation are also provided. Other systems, methods, features, and advantages of the invention will be or become apparent to one with skill in the art upon examination of the following figures and detailed description. It is intended that all such additional systems, methods, features, and advantages be included within this description, be within the scope of the invention, and be protected by the accompanying claims.

BRIEF DESCRIPTION OF THE FIGURES

The invention can be better understood with reference to the following figures. The components within the figures are not necessarily to scale, emphasis instead being placed upon clearly illustrating the principles of the invention. Moreover, in the figures, like reference numerals designate corresponding parts throughout the different views.

DETAILED DESCRIPTION

Although described with particular reference to a portable transceiver, the quadrature subharmonic mixer can be implemented in any communication device employing a mixer.

The quadrature subharmonic mixer can be implemented in hardware, software, or a combination of hardware and software. When implemented in hardware, the quadrature subharmonic mixer can be implemented using specialized hardware elements and logic. When the quadrature subharmonic mixer is implemented partially in software, the software portion can be used to control the mixer components so that various operating aspects can be software-controlled. The software can be stored in a memory and executed by a suitable instruction execution system (microprocessor). The hardware implementation of the quadrature subharmonic mixer can include any or a combination of the following technologies, which are all well known in the art: discreet electronic components, a discrete logic circuit(s) having logic gates for implementing logic functions upon data signals, an application specific integrated circuit having appropriate logic gates, a programmable gate array(s) (PGA), a field programmable gate array (FPGA), etc.

The software for the quadrature subharmonic mixer comprises an ordered listing of executable instructions for implementing logical functions, and can be embodied in any computer-readable medium for use by or in connection with an instruction execution system, apparatus, or device, such as a computer-based system, processor-containing system, or other system that can fetch the instructions from the instruction execution system, apparatus, or device and execute the instructions.

In the context of this document, a "computer-readable medium" can be any means that can contain, store, communicate, propagate, or transport the program for use by or in connection with the instruction execution system, apparatus, or device. The computer readable medium can be, for example but not limited to, an electronic, magnetic, optical, electromagnetic, infrared, or semiconductor system, apparatus, device, or propagation medium. More specific examples (a non-exhaustive list) of the computer-readable medium would include the following: an electrical connection (electronic) having one or more wires, a portable computer diskette (magnetic), a random access memory (RAM), a read-only memory (ROM), an erasable programmable read-only memory (EPROM or Flash memory) (magnetic), an optical fiber (optical), and a portable compact disc read-only memory (CDROM) (optical). Note that the computer-readable medium could even be paper or another suitable medium upon which the program is printed, as the program can be electronically captured, via for instance optical scanning of the paper or other medium, then compiled, interpreted or otherwise processed in a suitable manner if necessary, and then stored in a computer memory.

Figure 1:
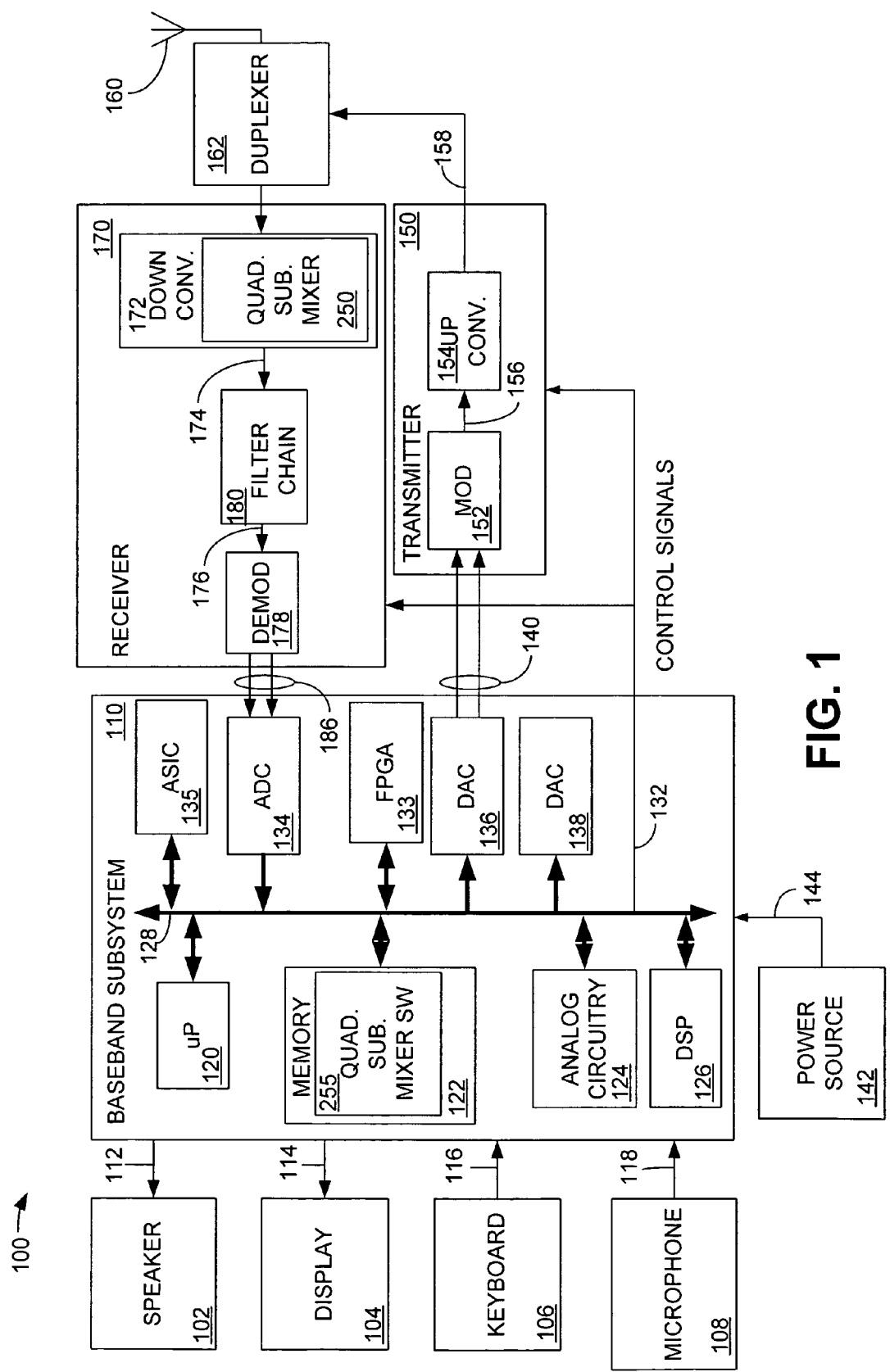
FIG. 1 is a block diagram illustrating a simplified portable transceiver including a quadrature subharmonic mixer in accordance with the invention.

FIG. 1 is a block diagram illustrating a simplified portable transceiver 100 including a quadrature subharmonic mixer. The portable transceiver 100 includes speaker 102, display 104, keyboard 106, and microphone 108, all connected to baseband subsystem 110. A power source 142, which may be a direct current (DC) battery or other power source, is also connected to the baseband subsystem 110 via connection 144 to provide power to the portable transceiver 100. In a particular embodiment, portable transceiver 100 can be, for example but not limited to, a portable telecommunication device such as a mobile cellular-type telephone. Speaker 102 and display 104 receive signals from baseband subsystem 110 via connections 112 and 114, respectively, as known to those skilled in the art. Similarly, keyboard 106 and microphone 108 supply signals to baseband subsystem 110 via connections 116 and 118, respectively. Baseband subsystem 110 includes microprocessor (µP) 120, memory 122, analog circuitry 124, and digital signal processor (DSP) 126 in communication via bus 128. Bus 128, although shown as a single bus, may be implemented using multiple busses connected as necessary among the subsystems within baseband subsystem 110.

Depending on the manner in which the quadrature subharmonic mixer is implemented, the baseband subsystem 110 may also include an application specific integrated circuit (ASIC) 135 and a field programmable gate array (FPGA) 133.

Microprocessor 120 and memory 122 provide the signal timing, processing and storage functions for portable transceiver 100. Analog circuitry 124 provides the analog processing functions for the signals within baseband subsystem 110. Baseband subsystem 110 provides control signals to transmitter 150 and receiver 170 via connection 132. Although shown as a single connection 132, the control signals may originate from the DSP 126, the ASIC 135, the FPGA 133, or from microprocessor 120, and are supplied to a variety of connections within the transmitter 150 and the receiver 170. It should be noted that, for simplicity, only the basic components of portable transceiver 100 are illustrated herein. The control signals provided by the baseband subsystem 110 control the various components within the transmitter 150 and the receiver 170.

If portions of the quadrature subharmonic mixer are implemented in software that is executed by the microprocessor 120, the memory 122 will also include quadrature subharmonic mixer software 255. The quadrature subharmonic mixer software 255 comprises one or more executable code segments that can be stored in the memory and executed in the microprocessor 120. Alternatively, the functionality of the quadrature subharmonic mixer software 255 can be coded into the ASIC 135 or can be executed by the FPGA 133. Because the memory 122 can be rewritable and because the FPGA 133 is reprogrammable, updates to the quadrature subharmonic mixer software 255 can be remotely sent to and saved in the portable transceiver 100 when implemented using either of these methodologies.

Baseband subsystem 110 also includes analog-to-digital converter (ADC) 134 and digital-to-analog converters (DACs) 136 and 138. Although DACs 136 and 138 are illustrated as separate devices, it is understood that a single digital-to-analog converter may be used that performs the function of DACs 136 and 138. ADC 134, DAC 136 and DAC 138 also communicate with microprocessor 120, memory 122, analog circuitry 124 and DSP 126 via bus 128. DAC 136 converts the digital communication information within baseband subsystem 110 into an analog signal for transmission to a modulator 152 via connection 140. Connection 140, while shown as two directed arrows, includes the information that is to be transmitted by the transmitter 150 after conversion from the digital domain to the analog domain.

The transmitter 150 includes modulator 152, which modulates the analog information in connection 140 and provides a modulated signal via connection 156 to upconverter 154. The upconverter 154 transforms and amplifies the modulated signal on connection 156 to an appropriate transmit frequency and power level for the system in which the portable transceiver 100 is designed to operate. Details of the modulator 152 and the upconverter 154 have been omitted for simplicity, as they will be understood by those skilled in the art. For example, the data on connection 140 is generally formatted by the baseband subsystem 110 into in-phase (I) and quadrature (Q) components. The I and Q components may take different forms and be formatted differently depending upon the communication standard being employed.

The upconverter 154 supplies the upconverted signal via connection 158 to duplexer 162. The duplexer comprises a filter pair that allows simultaneous passage of both transmit signals and receive signals, as known to those having ordinary skill in the art. The transmit signal is supplied from the duplexer 164 to the antenna 160.

A signal received by antenna 160 will be directed from the duplexer 162 to the receiver 170. The receiver 170 includes a downconverter 172, a filter chain 180, and a demodulator 178. The downconverter 172 includes, among other elements, a quadrature subharmonic mixer 250. If implemented using a direct conversion receiver (DCR), the downconverter 172 converts the received signal from an RF level to a baseband level (DC). Alternatively, the received RF signal may be downconverted to an intermediate frequency (IF) signal, depending on the application. The downconverted signal is sent to the filter chain 180 via connection 174. The filter chain comprises a least one filter stage to filter the received downconverted signal as known in the art.

The filtered signal is sent from the filter chain 180 via connection 176 to the demodulator. The demodulator 178 recovers the transmitted analog information and supplies a signal representing this information via connection 186 to ADC 134. ADC 134 converts these analog signals to a digital signal at baseband frequency and transfers the signal via bus 128 to DSP 126 for further processing.

Figure 2:
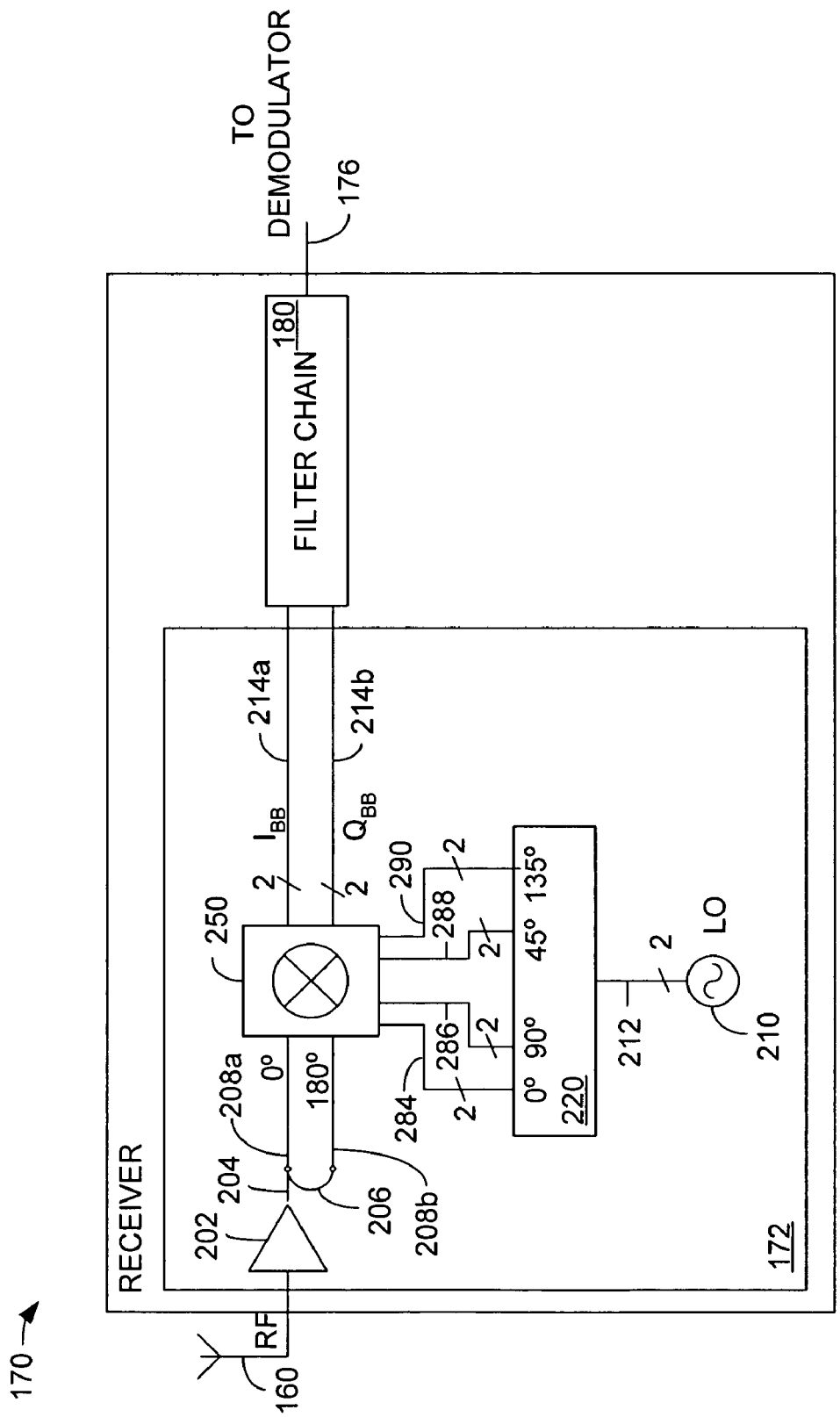
FIG. 2 is a block diagram illustrating an embodiment of the receiver of FIG. 1.

FIG. 2 is a block diagram illustrating an embodiment of the receiver 170 of FIG. 1. The receiver 170 receives a signal via antenna 160, which supplies the received signal at an RF frequency level via the duplexer (not shown) to low noise amplifier (LNA) 202. The LNA 202 amplifies the received signal and provides the amplified signal on connection 204 to a balun 206. The balun 206 receives the single ended signal on connection 204 and generates a differential RF signal on connections 208a and 208b. Alternatively, other devices capable of generating a differential RF signal may be used in place of the balun 206. The output of the balun 206 on connections 208a and 208b represent the received RF signal having portions that are separated in phase by 180°. For example, the signal on connection 208a can be at 0° and the signal on connection 208b can be at 180°. The output of the balun 206 is supplied via connections 208a and 208b to the quadrature subharmonic mixer 250.

The quadrature subharmonic mixer 250 receives quadrature LO signals on connections 284, 286, 288 and 290 that are 45° offset in phase from each other. The 0° and 90° signals on connections 284 and 286 form one of the quadrature LO signals and the 45° and 135° signals on connections 288 and 290 form the other quadrature LO signals. A frequency reference signal, also called a "local oscillator" signal, or "LO," is generated by a synthesizer 210 on connection 212. The LO signal on connection 212, which comprises a differential signal having 0° and 180° phase components, is supplied to a phase altering element 220. The phase altering element 220 generates the quadrature LO signals on connections 284, 286, 288 and 290 that are supplied to the mixer 250. The frequency of the LO signal determines the frequency to which the quadrature subharmonic mixer 250 downconverts the signal received from the balun 206 on connections 208a and 208b. In accordance with an embodiment of the invention, the LO signal supplied to the quadrature subharmonic mixer 250 via connection 212 comprises a plurality of quadrature phase offset signals that allow the quadrature subharmonic mixer 250 to operate on an RF signal that has not been phase shifted. In this manner, lossy polyphase filtering in the RF path is avoided. The output of the quadrature subharmonic mixer 250 is provided on connections 214a and 214b to the filter chain 180. The signal on connection 214a is the downconverted in-phase baseband signal ($I_{BB}$) and the signal on connection 214b is the downconverted quadrature baseband signal ($Q_{BB}$).

The signal on connection 214 is supplied to the filter chain 180 and then to the demodulator (not shown) via connection 176.

Figure 3:
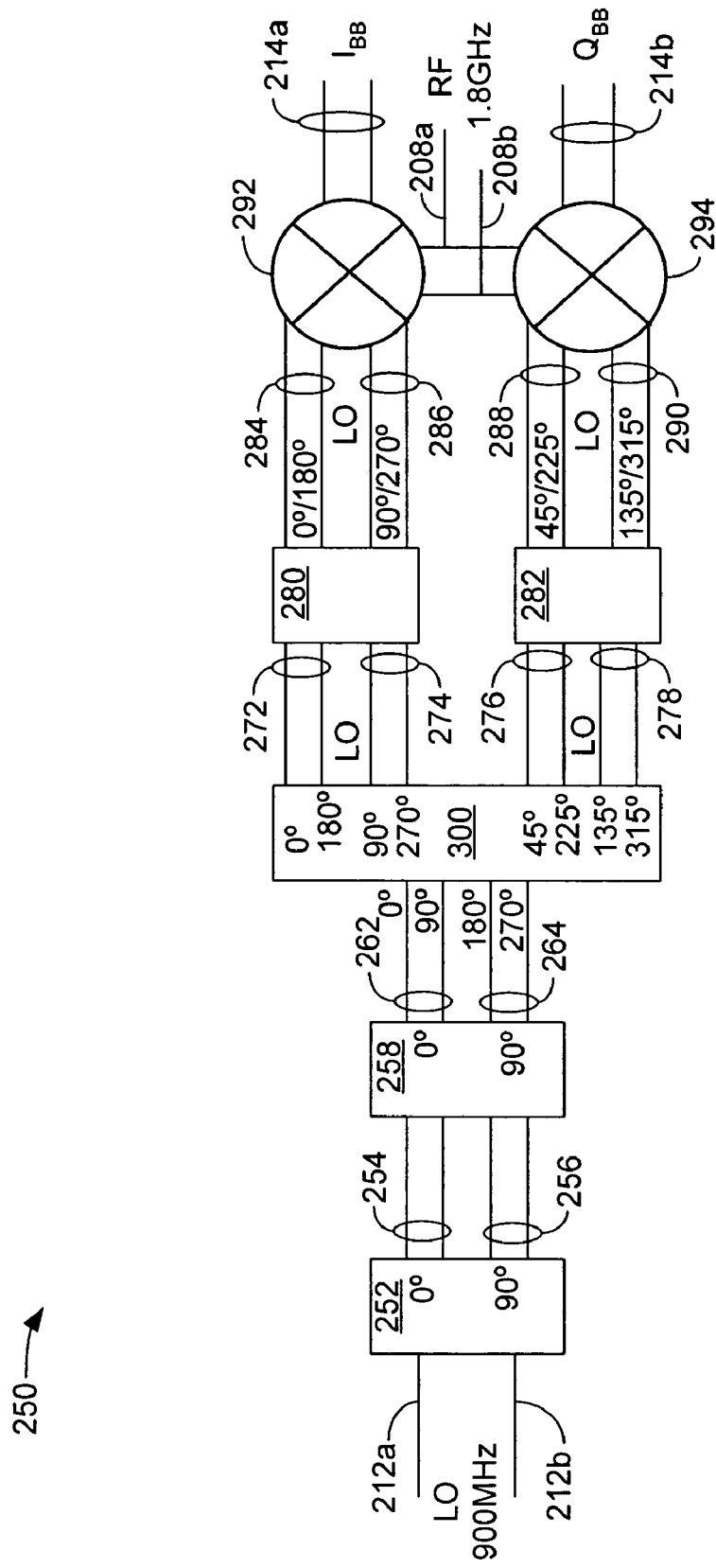
FIG. 3 is a schematic diagram illustrating the quadrature subharmonic mixer of FIG. 2.

FIG. 3 is a block diagram illustrating the quadrature subharmonic mixer 250. The quadrature subharmonic mixer 250 receives the LO signal via connections 212a and 212b, which corresponds to the connection 212 in FIG. 2. In this embodiment, and as an example only, the LO signal is at a frequency of 900 megahertz (MHz), which is one-half of the 1.8 gigahertz (GHz) radio frequency (RF) receive signal. The signal on connections 212a and 212b is the LO reference signal supplied by the synthesizer 210 of FIG. 2. In one embodiment, the LO signal on connections 212a and 212b are supplied to a first polyphase filter 252. The polyphase filter is one manner of generating the quadrature components of the LO signal. Alternatively, dividers or a quadrature voltage controlled oscillator (VCO) can be used to generate the quadrature components of the LO signal. Further, a single, two-stage polyphase filter can be used instead of the two single-stage polyphase filters 252 and 258.

The polyphase filter 252 receives the LO signal on connections 212a and 212b, and generates 90° offset signals on differential pair connections 254 and 256. Each of the differential pair connections 254 and 256 represent a differential pair signal representing the LO signal supplied to the polyphase filter 252, offset in phase by 90°. The differential pair 252 and the differential pair 256 supply the 90° offset phase signals to a second polyphase filter 258. The second polyphase filter 258 operates similar to the first polyphase filter 252 and generates 90° offset phase signals on differential pair connections 262 and 264. The polyphase filters 252 and 258 comprise resistive (R) and capacitive (C) circuitry having a low pass path and a high pass path. The low pass path delays the phase of the input signal by 45° and the high pass path advances the phase of the input signal by 45°.

The output of the second polyphase filter 258 is supplied to a vector sum and scale element 300. As will be described below in FIG. 4, the vector sum and scale element 300 receives the differential pair signals representing 0°, 90°, 180° and 270° from the polyphase filter 258 and generates 0°, 45°, 90°, 135°, 180°, 225°, 270° and 315° phase signals on differential pair connections 272, 274, 276 and 278.

The 0° and 180° local oscillator signal on differential pair 272 and the 90° and 270° local oscillator signal on differential pair 274 are supplied to the buffer 280. Similarly, the 45° and 225° local oscillator signal on differential pair 276 and the 135° and 315° local oscillator signal on differential pair 278 are supplied to the buffer 282. The buffers 280 and 282 buffer the signals and provide amplified and waveshaped versions of the 0°, 45°, 90°, 135°, 180°, 225°, 270° and 315° phase signals on differential pairs 284, 286, 288 and 290. The 0° and 180° local oscillator signal on differential pair 284 and the 90° and 270° local oscillator signal on differential pair on 286 are supplied to the mixer core 292. The 45° and 225° local oscillator signal on differential pair 288 and the 135° and 315° local oscillator signal on differential pair 290 are supplied to the mixer core 294. The mixer core 292 and the mixer core 294 also receive the received radio frequency (RF) signal via connection 208a and 208b. These signals are received from the balun 206 (FIG. 2) as described above. In accordance with this embodiment of the quadrature subharmonic mixer, the RF signal on connections 208a and 208b is at an exemplary frequency of 1.8 GHz, and the local oscillator signal on connections 212a and 212 is at one-half the RF frequency, or 900 MHz. The quadrature LO signals on connections 284, 286, 288 and 290 supplied to the mixer cores 292 and 294 are 45° offset in phase from each other. The 0°/180° and 90°/270° signals on connections 284 and 286, respectively, form one of the quadrature LO signals and the 45°/225° and 135°/315° signals on connections 288 and 290, respectively, form the other quadrature LO signals. In this manner, the quadrature subharmonic mixer 250 downconverts the received RF signal to recover the baseband data without altering the phase of the received RF signal. Instead, the phase of LO reference signal is altered as described above, avoiding loss in the RF path and improving receiver sensitivity.

The output of the mixer core 292 is supplied via differential pair 214a, and includes the in-phase portion of the baseband signal ($I_{BB}$), and the output of the mixer core 294 on differential pair 214b contains the quadrature portion of the baseband signal ($Q_{BB}$). In this manner, by implementing a quadrature subharmonic mixer 250 as shown in FIG. 3, polyphase filtering is eliminated from the RF path and only occurs in the LO path. In this manner, the RF loss of the circuitry used to implement the quadrature subharmonic mixer 250 can be reduced.

Figure 4:
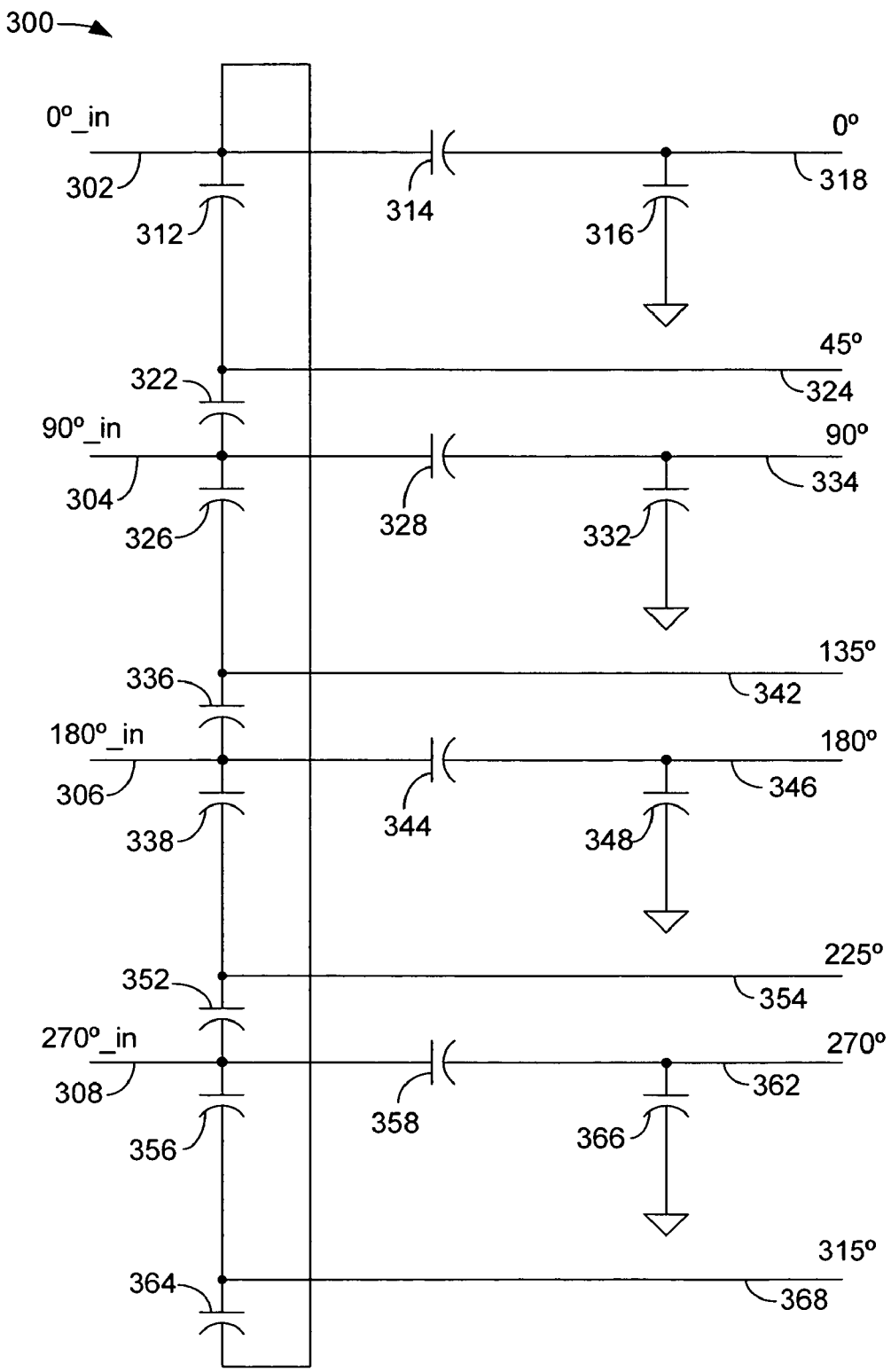
FIG. 4 is a schematic diagram illustrating the scaling and vector summing element of the quadrature subharmonic mixer of FIG. 3.

FIG. 4 is a block diagram illustrating an embodiment of the vector sum and scale element 300 of FIG. 3. The 0°, 90°, 180° and 270° local oscillator input signals derived by the first polyphase filter 252 and the second polyphase filter 258 are supplied via connections 302, 304, 306 and 308, respectively. The capacitors 312, 314, 316 and 322, are the passive components that provide the 0° output on connection 318 and the 45° output on connection 324. If the 0° input on connection 302 and the 90° input on connection 304 are vector summed to provide the 45° signal on connection 324, the magnitude of the 45° signal on connection 324 would have a magnitude equal to $\sqrt{2}$, if the magnitude of the 0° signal on connection 302 and the 90° signal on connection 304 each equal magnitude 1. In accordance with this embodiment of the invention, to equalize the magnitude of the 45° signal on connection 324 to the magnitude of the signal on connections 318 and 334, the capacitors 312, 314, 322 and 316 function to scale the output of the 45° vector on connection 324 to have a magnitude equal to the magnitude of the 0° signal on connection 318 and the 90° signal on connection 334.

Similarly, the capacitors 326, 328, 332 and 336 are the passive components used to generate the 135° signal on connection 342 using the 90° input on connection 304 and the 180° input on connection 306. Similarly, the capacitors 338, 344, 348 and 352 are the passive components used to generate the 225° signal on connection 354 using the 180° signal and the 270° signal on connections 306 and 308, respectively. Finally, the capacitors 356, 358, 366 and 364 are the passive components used to generate the 315° signal on connection 368 using as input the 0° signal on connection 302 and the 270° signal on connection 308. Similar to the 45° output on connection 324, the 135° output, the 225° output and the 315° output are each scaled to have a magnitude equal to the magnitude of the 0°, 90°, 180° and 270° signals. The architecture in the vector sum and scale element 300 reduces current and power consumption by using only passive components to perform the vector summation and scaling.

Figure 5:
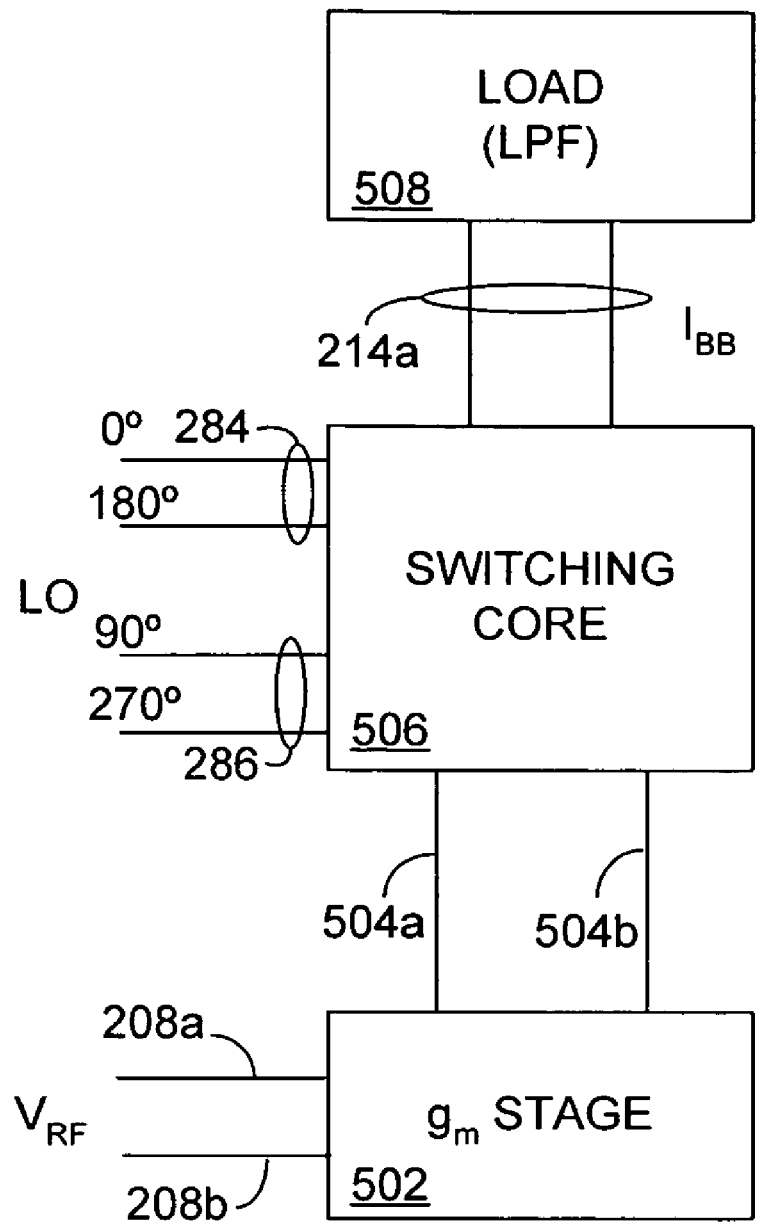
FIG. 5 is a block diagram illustrating the mixer of FIG. 3.

FIG. 5 is a block diagram illustrating a subharmonic 500. The subharmonic mixer 500 comprises a switching core 506, a load (implemented as a low pass filter (LPF)) 508 and a $g_m$ stage 502. The $g_m$ stage 502 receives a radio frequency voltage signal, $V_{RF}$, via connections 208a and 208b and provides a current signal, I, via connections 504a and 504b. Essentially, the $g_m$ stage 502 functions as a voltage to current converter. The output of the $g_m$ stage 502 on connections 504a and 504b is supplied to the switching core 506. The switching core 506 also receives the 0°/180° and the 90°/270° quadrature local oscillator (LO) signals via connections 284 and 286, respectively, and provides the differential in-phase baseband ($I_{BB}$) output via connection 214a. The switching core 506 corresponds to the mixer core 292 of FIG. 3 and switches the current on connections 504a and 504b to create harmonics that are filtered out by the load 508 resulting in the differential baseband signal on connection 214a. Although not shown in FIG. 5, when the 45°/225° and the 135°/315° quadrature LO signals are applied to the mixer core, the resultant output is the differential quadrature baseband ($Q_{BB}$) signals corresponding to connection 214b in FIGS. 2 and 3. In a subharmonic mixer 500, the LO signal is effectively multiplied by two in the switching core. The RF signal is multiplied by 2*LO and downconverted to a baseband level signal.

Figure 6:
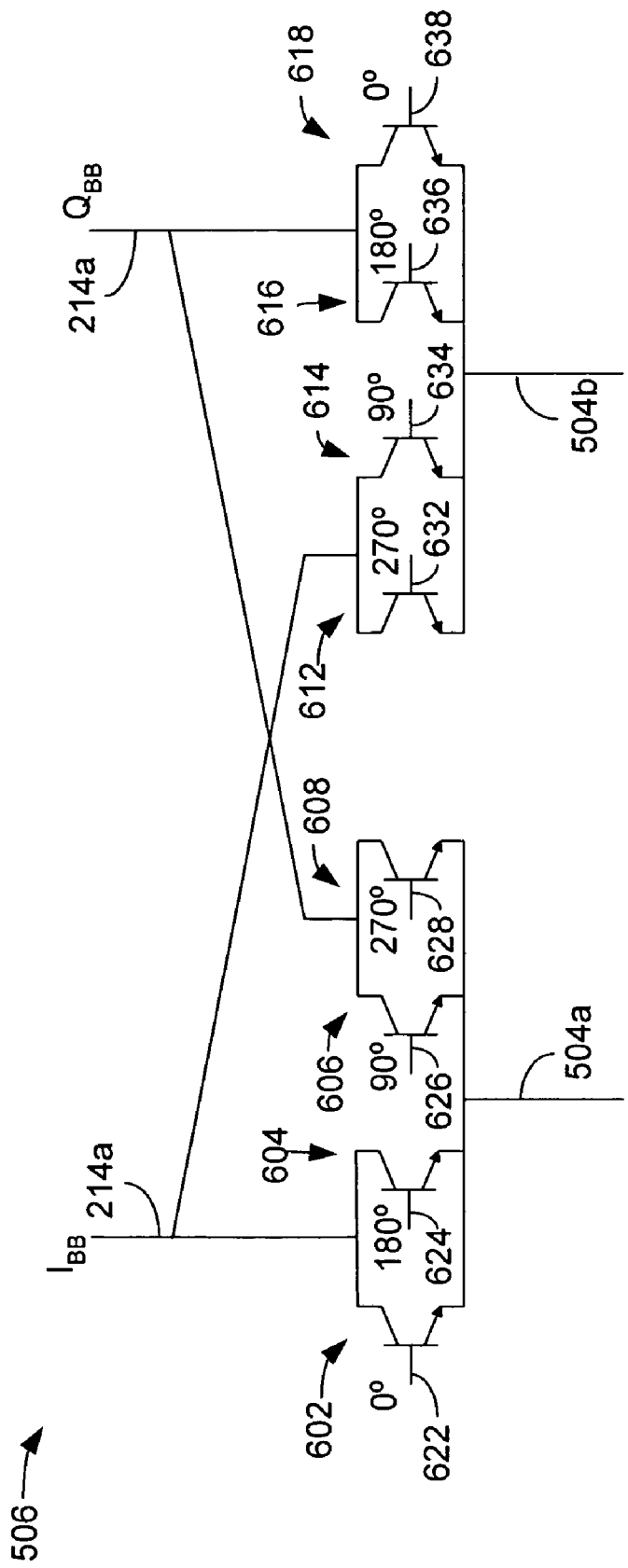
FIG. 6 is a schematic diagram illustrating the switching core of FIG. 5.

FIG. 6 is a schematic diagram illustrating the switching core 506 of FIG. 5. The switching core 506 comprises transistors 602, 604, 606, 608 adapted to receive the output of the $g_m$ stage 502 via connection 504a and transistors 612, 614, 616 and 618 adapted to receive the output of the $g_m$ stage 502 via connection 504b. The transistors can be implemented using, for example, heterojunction transistor (HBT) technology, or can be implemented using complimentary metal oxide semiconductor (CMOS), bi-CMOS, or other technology. The transistors 602, 604, 606 and 608 receive the 0°, 180°, 90° and 270° LO signals on connections 622, 624, 626 and 628, respectively. The transistors 612, 614, 616 and 618, receive the 270°, 90°, 180° and 0° LO signals on connections 632, 634, 636 and 638, respectively. The output of the switching core 506 is the in-phase portion ($I_{BB}$) of the baseband signal on connection 214a, and the quadrature portion ($Q_{BB}$) of the baseband signal on connection 214b.

Figure 7:
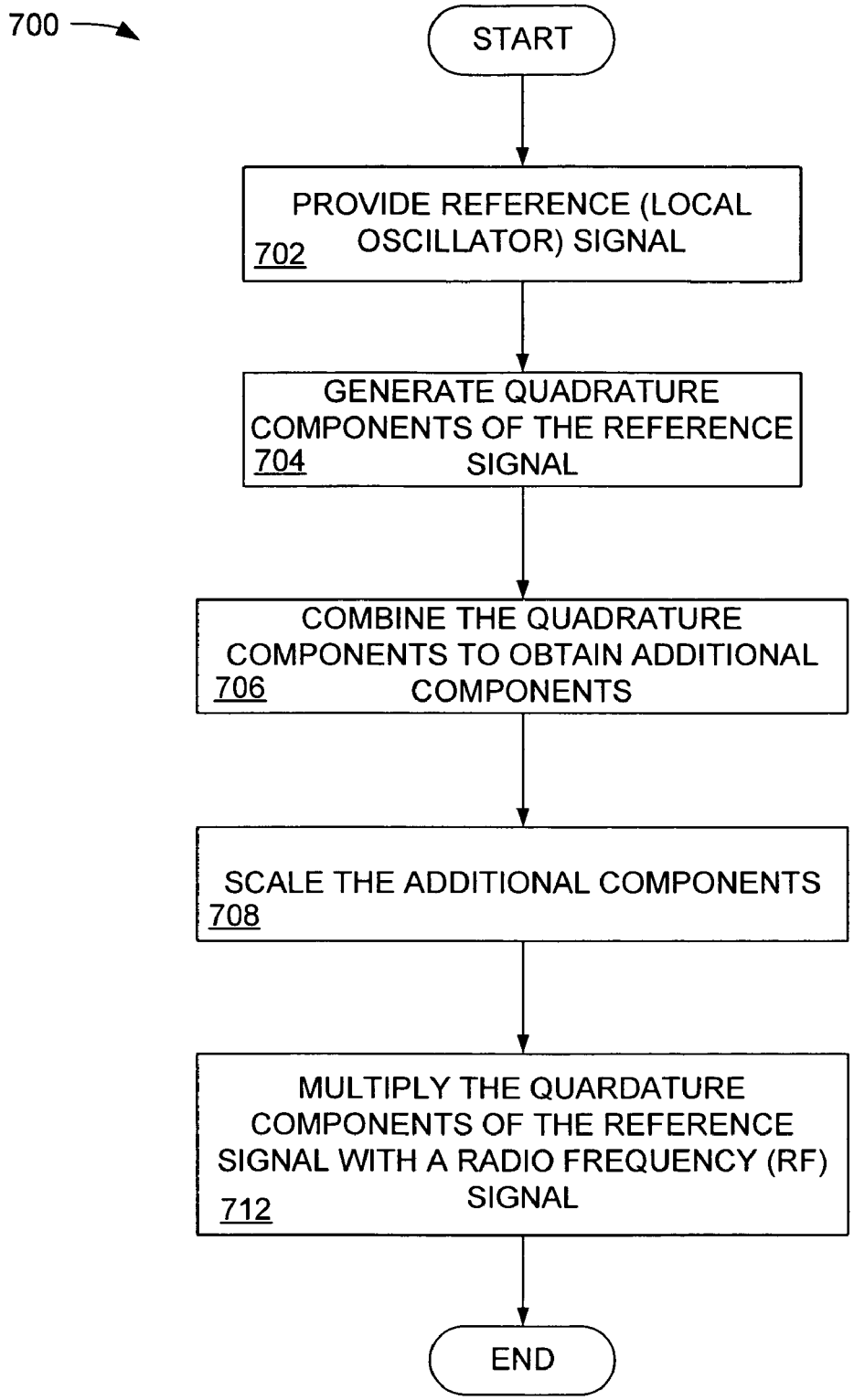
FIG. 7 is a flow chart describing the operation of an embodiment of the quadrature subharmonic mixer of FIG. 3.

FIG. 7 is a flow chart 700 describing the operation of an embodiment of the quadrature subharmonic mixer 250 of FIG. 3. The steps in the blocks of the flowchart may be performed in the order shown, out of the order shown or may be performed concurrently. In block 702 a local oscillator reference signal is provided. In block 704, the quadrature components of the local oscillator reference signal are generated.

In block 706, the 0°, 90°, 180° and 270° outputs are summed and scaled by the vector sum and scale element 300 (FIG. 4) to provide the 0°, 45°, 90°, 135°, 180°, 225°, 270°, and 315° local oscillator reference signals that will be provided to the mixer cores. In block 708, the additional quadrature components (i.e., the 45°, the 135°, the 225°, and the 315°) signals are scaled as described above in FIG. 4.

In block 712, the quadrature components of the local oscillator signal are multiplied with the received RF signal in the mixer core 292 and 294 to produce the downconverted in-phase (I) and quadrature (Q) baseband signals on connections 214a and 214b.

Figure 8:
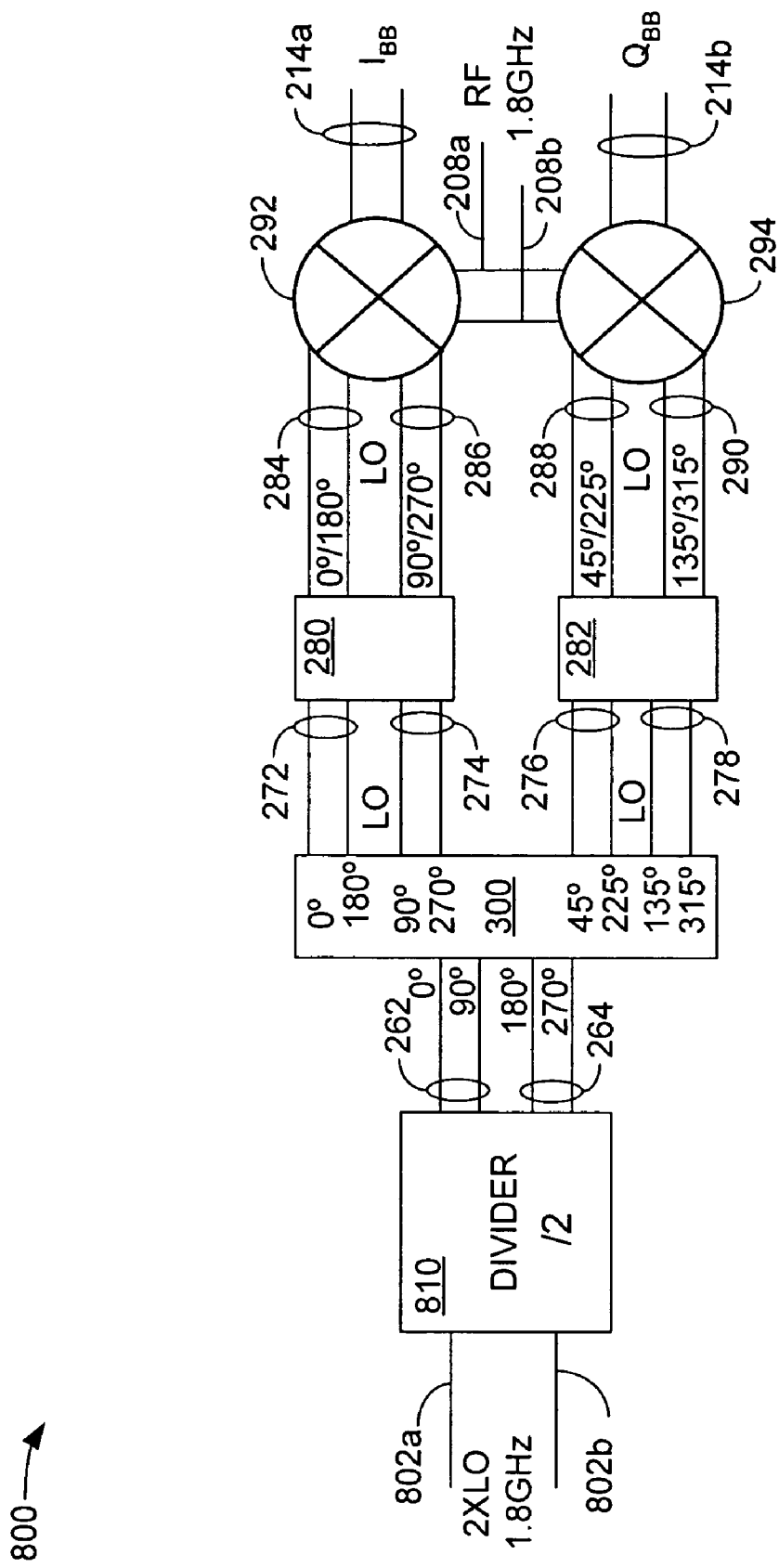
FIG. 8 is an alternative embodiment of the quadrature subharmonic mixer of FIG. 3.

FIG. 8 is an alternative embodiment of the quadrature subharmonic mixer of FIG. 3. In this embodiment, an LO signal at twice (2×) the LO frequency of 900 MHz (1.8 GHz in this embodiment) is supplied to a "divide-by-two" divider 810 in the quadrature subharmonic mixer 800. Alternatively, a signal at four times the LO frequency can be supplied to a "divide-by-four" divider. The divider 810 then creates the quadrature LO signals on connections 262 and 264 that are supplied to the vector and sum element 300.

While various embodiments of the invention have been described, it will be apparent to those of ordinary skill in the art that many more embodiments and implementations are possible that are within the scope of this invention. Accordingly, the invention is not to be restricted except in light of the attached claims and their equivalents.

What is claimed is:

1. A method for operating a subharmonic mixer, comprising:
   providing a reference signal;
   operating on the reference signal to create quadrature components of the reference signal;
   summing the quadrature components of the reference signal to obtain additional components of the reference signal that are phase separated from the quadrature components;
   scaling the additional components to be substantially equal in magnitude to the quadrature components; and
   multiplying the quadrature components and the additional components of the reference signal with a radio frequency (RF) signal to obtain a downconverted version of the RF signal.

2. The method of claim 1, further comprising obtaining an in-phase baseband component and a quadrature baseband component of the RF signal.

3. The method of claim 2, further comprising amplifying the RF signal before the combining step, wherein the RF signal is otherwise unmodified.

4. The method of claim 3, wherein the scaling step and the combining step are implemented using passive components.

5. A quadrature subharmonic mixer, comprising:
   a polyphase filter configured to generate quadrature components of a local oscillator (LO) reference signal;
   a summing and scaling element configured to create additional components of the LO reference signal such that the additional components and the quadrature components of the LO reference signal are substantially equal in magnitude to each other; and
   a plurality of mixer elements configured to combine the quadrature components of the LO reference signal and the additional components of the LO reference signal with a radio frequency (RF) signal to obtain a downconverted version of the RF signal.

6. The quadrature subharmonic mixer of claim 5, wherein the summing and scaling element further comprises passive components.

7. The quadrature subharmonic mixer of claim 6, wherein the RF signal is amplified before being supplied to the mixer elements, wherein the RF signal is otherwise unmodified.

8. The quadrature subharmonic mixer of claim 7, wherein the plurality of mixer elements provides an in-phase baseband component and a quadrature baseband component of the RF signal.

9. A portable transceiver, comprising:
   a receiver for receiving a radio frequency (RF) signal;
   a polyphase filter configured to generate quadrature components of a local oscillator (LO) reference signal;
   a summing and scaling element configured to create additional components of the LO reference signal such that the additional components and the quadrature components of the LO reference signal are substantially equal in magnitude to each other; and
   a plurality of mixer elements configured to multiply the quadrature components of the LO reference signal and the additional components of the LO reference signal with the RF signal to obtain a downconverted version of the RF signal.

10. The portable transceiver of claim 9, wherein the summing and scaling element further comprises passive components.

11. The portable transceiver of claim 10, wherein the RF signal is amplified before being supplied to the mixer elements, wherein the RF signal is otherwise unmodified.

12. The portable transceiver of claim 11, wherein the plurality of mixer elements provides an in-phase baseband component and a quadrature baseband component of the RF signal.

13. A portable transceiver, comprising:
   means for receiving a radio frequency (RF) signal;
   means for generating quadrature components of a local oscillator (LO) reference signal;
   means for summing and scaling the LO reference signal to create additional components of the LO reference signal such that the additional components and the quadrature components of the LO reference signal are substantially equal in magnitude to each other; and
   means for multiplying the quadrature components of the LO reference signal and the additional components of the LO reference signal with the RF signal to obtain downconverted version of the RF signal.

14. The portable transceiver of claim 13, wherein the summing and scaling means further comprises passive component means.

15. The portable transceiver of claim 14, further comprising means for amplifying the RF signal, wherein the RF signal is otherwise unmodified.

16. The portable transceiver of claim 15, wherein the combining means provides an in-phase baseband component and a quadrature baseband component of the RF signal.

17. The portable transceiver of claim 15, wherein the means for generating quadrature components of a local oscillator (LO) reference signal further comprises polyphase filter means.

18. The portable transceiver of claim 15, wherein the means for generating quadrature components of a local oscillator (LO) reference signal further comprises divider means.

* * * * *